United States Patent [19]
Arima et al.

[11] Patent Number: 5,281,151
[45] Date of Patent: Jan. 25, 1994

[54] SEMICONDUCTOR CHIP CARRIER, MODULE HAVING SAME CHIP CARRIER MOUNTED THEREIN, AND ELECTRONIC DEVICE INCORPORATING SAME MODULE

[75] Inventors: Hideo Arima, Yokohama; Kenji Takeda, Kamakura; Hideho Yamamura, Yokohama; Fumiyuki Kobayashi, Sagamihara, all of Japan

[73] Assignee: Hitachi, Ltd., Tokyo, Japan

[21] Appl. No.: 902,996

[22] Filed: Jun. 23, 1992

[30] Foreign Application Priority Data

Jul. 5, 1991 [JP] Japan .................. 3-165557

[51] Int. Cl.⁵ .................................................. H05K 1/11
[52] U.S. Cl. .................................... 439/68; 361/777; 361/792; 174/255; 174/261; 257/778
[58] Field of Search .............. 174/250, 255, 256, 257, 174/261; 257/723, 778; 361/396, 400, 406, 409, 412, 414, 416-419; 439/47, 66, 68, 91

[56] References Cited

U.S. PATENT DOCUMENTS

| | | | |
|---|---|---|---|
| 4,924,353 | 5/1990 | Patraw | 361/400 |
| 4,937,707 | 6/1990 | McBride et al. | 361/400 |
| 4,967,314 | 10/1990 | Higgins, III | 361/414 |
| 5,019,945 | 5/1991 | Smolley | 361/412 |
| 5,157,589 | 10/1992 | Cole, Jr. et al. | 361/414 |
| 5,165,984 | 11/1992 | Schoenthaler | 361/414 |

OTHER PUBLICATIONS

"Hard Ware Technology of the Ultra-Large Processor Group Hitac M-880," Hitachi Hyoron, vol. 73, No. 2, (1991-2), pp. 41-48. (Japanese).

*Primary Examiner*—Gary F. Paumen
*Attorney, Agent, or Firm*—Fay, Sharpe, Beall, Fagan, Minnich & McKee

[57] ABSTRACT

A semiconductor chip carrier, an electronic module having the semiconductor chip carrier mounted therein, and an electronic device incorporating the electronic module. A semiconductor chip carrier comprises a multi-layer wiring substrate including a multi-layer ceramic board, and a thin film circuit mounted on said multi-layer ceramic board, and a semiconductor chip mounted and connected to the thin film circuit, wherein a low-resistance conductor path is provided on the surface of or in the multi-layer wiring substrate to connect between signal terminals which need to be connected with a low-resistance wire in the semiconductor chip, thereby realizing signal transmission at low resistance between the signal terminals of the semiconductor chip by this conductor path. This arrangement makes it possible to shorten the signal delay time of a semiconductor chip, and achieve higher speed signal processing in modules and electronic equipment in which a thus-improved semiconductor chip is used.

5 Claims, 13 Drawing Sheets

SEMICONDUCTOR CHIP CARRIER, MODULE HAVING SAME CHIP CARRIER MOUNTED THEREIN, AND ELECTRONIC DEVICE INCORPORATING SAME MODULE

BACKGROUND OF THE INVENTION

This invention relates to a wiring substrate having a semiconductor device mounted thereon and a module and an electronic device each using this substrate, and more particularly to a semiconductor chip carrier, module and electronic device for achieving an increase in speed of signal transmission in semiconductor devices.

Improvements have been made year after year in semiconductor chips responding to the strong requirements for higher integration, size enlargement, and greater speed of semiconductor chips mounted on semiconductor chip carriers. To be more concrete, the higher integration is achieved by increasing the element density in a chip by making the elements progressively more miniature, and enlarging the size of the chip. On the other hand, attempts have been made to obtain a higher speed of signal processing by realizing higher function of the elements and higher element density of the chip. However, the higher element density not only contributes to higher operation speed but also has an adverse effect of hindering the improvement of operation speed, which is becoming conspicuous in recent years. More specifically, as the higher the element density becomes, the wiring conductor width in the chip is getting narrower, which increases the wiring resistance, thus increasing the delay of signal transmission resulting from wiring reasons. This wiring delay has become an obstacle to realization of higher operation speed of semiconductor chips. An example of this is that the higher speed of the chip cannot be achieved unless the wiring for clock signal transmission, which can cause a signal delay, has low resistance in order to obtain operational synchronization with signals in the semiconductor chips.

In order to form a long wiring with low resistance in a chip, it is necessary to make improvements related to the material, width and thickness of wiring.

The substrate (hereafter referred to as a wiring substrate) on which a semiconductor chip is mounted expands the pitch of connection pads of semiconductor chips to facilitates connection to the wiring board. The wiring substrate often serves for sealing of the semiconductor chip.

As technology of this kind, there is "Hardware technology of the ultra-large processor group HITAC M-880" reported in Hitachi Hyouron "Vol. 73, No. 2, pp. 41–48 (1991-2)", for example.

Under this situation, it has conventionally necessary to achieve the higher speed of the semiconductor chip by the whole of a chip carrier including a chip. However, in achieving the higher speed of the semiconductor chip or chip carrier, it is essential to reduce the wiring delay which hinders the improvement of the signal processing speed as mentioned above.

SUMMARY OF THE INVENTION

It is therefore an object of the present invention to provide an improved semiconductor chip carrier to reduce the wiring delay.

Another object of the present invention is to provide a module having an improved semiconductor chip carrier mounted therein to reduce the wiring delay.

Still another object of the present invention is to provide electronic devices incorporating the above-mentioned module to reduce the wiring delay.

In order to achieve the above objects, in the present invention, a low-resistance wiring was formed not on a chip but on the surface of or inside a chip carrier.

As measures to reduce the wiring delay, there are three methods:

(1) Apply a copper wiring with low resistivity, for example
(2) Increase the width of the wiring conductor
(3) Increase the film thickness of the wiring conductor Wires conventionally applied to semiconductor chips are generally aluminum. Changing the wiring material in the middle of the process in which an aluminum wiring is formed on a semiconductor chip to copper or cold with lower resistivity than aluminum is makes the manufacturing process complicated. Increasing the width of the wiring conductor on a chip requires a part of the wiring to be altered, and if there are many wires to be made wider, it is difficult to form a wiring on a chip with a limited area. Further, increasing the film thickness of the wiring conductor increases the thin film deposition time, and the increased stresses by thicker wires and insulating films make it difficult to form multiple layers on the chip. That is, the wires and the insulating films are easily exfoliated, increasing chances of disconnection and short circuit.

On the other hand, in the case of a semiconductor chip carrier, circuits are formed on a wiring substrate of a harder material, such as ceramic and with a larger area than the semiconductor chip, so that it is easier to apply plating and thick film technology as well as thin film technology. Therefore, it is easy to form thick and wide copper wiring conductors by plating, thick film technology or the like.

As for the insulating materials, in semiconductor chips, the relative dielectric constant of silicon dioxide generally used is about 4.5. On the other hand, in chip carriers, it is possible to apply heat-resistant organic insulating materials with a low relative dielectric constant of about 3, such as polyimide. The decrease in the relative dielectric constant of the insulating material is effective in reducing the wiring delay.

The "low resistance of the conductor path connected at electrically low resistance" used in this specification means that the wiring resistance value of the conductor path in this invention is smaller than the resistance value when the wiring forming technology applied to the semiconductor chip is used to form a conductor path on the surface of or in a semiconductor circuit.

Description will be made of concrete means for achieving the objects of the present invention.

The main object of the present invention is achieved, in a semiconductor chip carrier having a semiconductor chip mounted and connected to a multi-layer wiring substrate, by using a semiconductor chip carrier made by providing a conductor path for connecting the signal terminals in the same semiconductor chip at electrically low resistance.

The above-mentioned multi-layer wiring substrate can comprise a first multi-layer wiring conductor constituted by a multi-layer ceramic board, and a second multi-layer wiring conductor constituted by a thin film circuit laminated and electrically connected to the first multi-layer wiring conductor. A semiconductor chip is mounted and connected to the second multi-layer wiring conductor.

Also, the above-mentioned multi-layer wiring substrate can comprise a first multi-layer wiring conductor constituted by a multi-layer ceramic board, and a second multi-layer wiring conductor constituted by a thin film circuit laminated and electrically connected to both sides of the first multi-layer wiring conductor. A semiconductor chip is mounted and connected to either one of the two surfaces of the second multi-layer wiring conductors.

The conductor path connecting the signal terminals in the above semiconductor chip at electrically low resistance is mounted to either one of both of the first multi-layer wiring conductor and the second multilayer wiring conductor.

The layer insulating films of the second multi-layer wiring conductor constituted by the abovementioned thin film circuit comprise heat-resistant organic insulating films, such as a polyimide resin film.

A sealing part is formed with a corrosion resistant metal, such as titanium and gold, at the peripheral portion of the first multi-layer wiring conductor constituted by the above-mentioned multi-layer ceramic board, and a sealing cap is connected to the sealing part for sealing the semiconductor chip mounted on the wiring substrate.

The longest portion of the conductor path for connecting the signal terminals in the same semiconductor chip at electrically low resistance may be directed in parallel with the direction of the main wiring on the surface of or in the semiconductor chip, or may be inclined at a specified angle to the main wiring direction.

One or any number, as necessity requires, of semiconductor chips may be mounted and connected to the above-mentioned semiconductor chip carrier.

Another object mentioned above is achieved by a electronic module having a plurality of the abovementioned semiconductor chip carrier mounted on the same wiring substrate. For the wiring substrate constituting the electronic module, a high density printed wiring substrate as well as a ceramic wiring substrate is used.

Still another object mentioned above is achieved by an electronic device comprising a processor board having a plurality of electronic modules mounted on the same wiring substrate. For the wiring substrate constituting the processor board, an ordinary printed wiring substrate is used.

In the chip carrier wiring substrate, the net signal transmission speed is in inverse proportion to the one-half power of the relative dielectric constant of the insulating layers around the wiring. Therefore, the lower the relative dielectric constant of the insulating layers around the wiring, the faster the signal transmission speed becomes, and in other words, the shorter the delay time becomes.

However, when the wiring resistance is high, the signal transmission speed is limited more by the wiring resistance than the relative dielectric constant of the insulating material.

To explain the wiring delay by the wiring resistance, the wiring resistance is evaluated considering a case in which a signal is transmitted through a resistance (R) to the terminal of the wiring having a wiring capacitance (C). As is obvious by the transient phenomenon theory, if consideration is made using the time when a pulse of voltage V is transmitted from the transmitting end as the reference point in time, the voltage at the receiving end is expressed by $V(1-\log(-t/\tau))$, where t is time, $\tau$ is the time constant and equal to $C \times R$. More specifically, the voltage is zero at the receiving end when a signal is transmitted by the transmitting end, and as time elapses, the voltage increases. If it is supposed that the receiving end receives the pulse from the transmitting end when the voltage at the receiving end reaches more than 50% of V, by setting $V(1-\log(-t/\tau))=0.5$, the transmission delay of the pulse is obtained as $0.69 \tau$ ($=0.69 \cdot CR$). In other words, the delay time of the wiring increases in proportion to the wiring resistance and the wiring capacitance.

Next, the wiring resistance is evaluated by applying the above theory to the actual wiring in the semiconductor chip and the chip carrier. By forming a low-resistance path on the board of the chip carrier, the wiring delay in the same semiconductor chip can be reduced. If wiring is formed on the semiconductor chip by a prior-art technology, generally, wiring is formed by aluminum, which is about 2 $\mu$m wide and about 0.2 $\mu$m thick. In this case, if the resistivity of aluminum is 2.7 $\mu\Omega \cdot$cm, from a formula of wiring resistance =(resistivity)$\div$(wiring sectional area), the wiring resistance is obtained as 680 $\Omega$/cm. When the layer insulating films are of silicon dioxide (relative dielectric constant : 4.5) and the insulating layer thickness is 0.5 $\mu$m, from a formula of wiring capacitance $=8.854 \times$ (relative dielectric constant)$\times$(opposed area)$\div$(insulating layer thickness), the wiring capacitance is obtained as 1.6 pF/cm. By rough estimation by $0.69 \times$(wiring resistance)$\times$(wiring capacitance) shown above, the propagation delay amounts to as much as 750 ps/cm. Using this as an example, when copper wiring is formed, which measures 20 $\mu$m both in wiring width and film thickness, on the carrier board, if the resistivity of copper is 1.7 $\mu\Omega \cdot$cm, the wiring resistance is obtained as 0.43 $\Omega$/cm from (resistivity)$\times$(wiring sectional area) described above. When the layer insulating films are of polyimide (relative dielectric constant is 3.3) and the insulating layer thickness is 20 $\mu$m, the wiring capacitance can be calculated as 0.29 pF/cm from $8.854 \times$(relative dielectric constant)$\times$(opposed area)$\div$(insulating layer thickness). The propagation delay can be obtained as 0.1 ps/cm by rough estimation from $0.69 \times$(wiring resistance)$\times$(wiring capacitance).

However, because the transmission speed is in inverse proportion to the one-half power of the relative dielectric constant of the insulating layer, the propagation delay is limited by (square root of the relative dielectric constant)$\div$(speed of light)$=61$ ps/cm. Consequently, the delay time can be reduced by about one digit (one order of magnitude) compared with the prior art.

As a wiring of the interior of the semiconductor chip is formed in the chip carrier board, a separate board, the length of the path is a little too long, but its amount is a few percent at most.

Unlike with the present invention which has a low-resistance wiring formed on or in the chip carrier board as described above, if an attempt is made to increase the wiring sectional area by increasing the wiring film thickness or width in the semiconductor chip by using the prior-art semiconductor technology, it is necessary to adopt a manufacturing method which is completely different from the prior-art semiconductor manufacturing technology, and it is also necessary to substantially change the wiring forming rules.

It is evident from the above description that according to the present invention, by forming a low-resistance wiring on or in the semiconductor chip carrier board, the delay time of the chip can be decreased substantially.

As for the insulating materials, silicon dioxide generally used for semiconductor chips in the prior art has a relative dielectric constant of about 4.5. In the case of a chip carrier according to the present invention, it is easy to apply organic insulating materials with a low relative dielectric constant of from 2.7 to 3.5. This decrease of the relative dielectric constant is effective in reducing the wiring delay owing to the dielectric constant and the wiring capacitance described above.

By the wiring rule of the semiconductor chip, wiring is formed in the direction in parallel with or 45° inclined with respect to the peripheral side of the chip generally in a square shape. With a chip carrier, it is easy to use a wiring rule different from that for the chip. In this case, inclined wiring can be easily formed on a chip carrier, which is difficult on the semiconductor chip, so that a conductor path, of which a reduction of resistance is most required, can be laid for electrical connection in a straight line.

Connection by the shortest distance is desirable for connection between the semiconductor chip and the wiring substrate for lower wiring resistance and lower inductance. In this respect, preferable ways of connection are surface connection by solder and surface connection by, say, gold bumps, formed on both mating surfaces, which bumps are mechanically deformed and joined.

The above-mentioned function and the effect do not depend on the number of semiconductor chips mounted on a semiconductor chip carrier. Therefore, a plurality of semiconductor chips can be mounted on the chip carrier.

BRIEF DESCRIPTION OF THE DRAWINGS

Preferred embodiments of the present invention will now be described in with the accompanying drawings, in which.

DESCRIPTION OF THE PREFERRED EMBODIMENTS

Representative embodiments of the present invention will be described with reference to the accompanying drawings.

Figure 1:
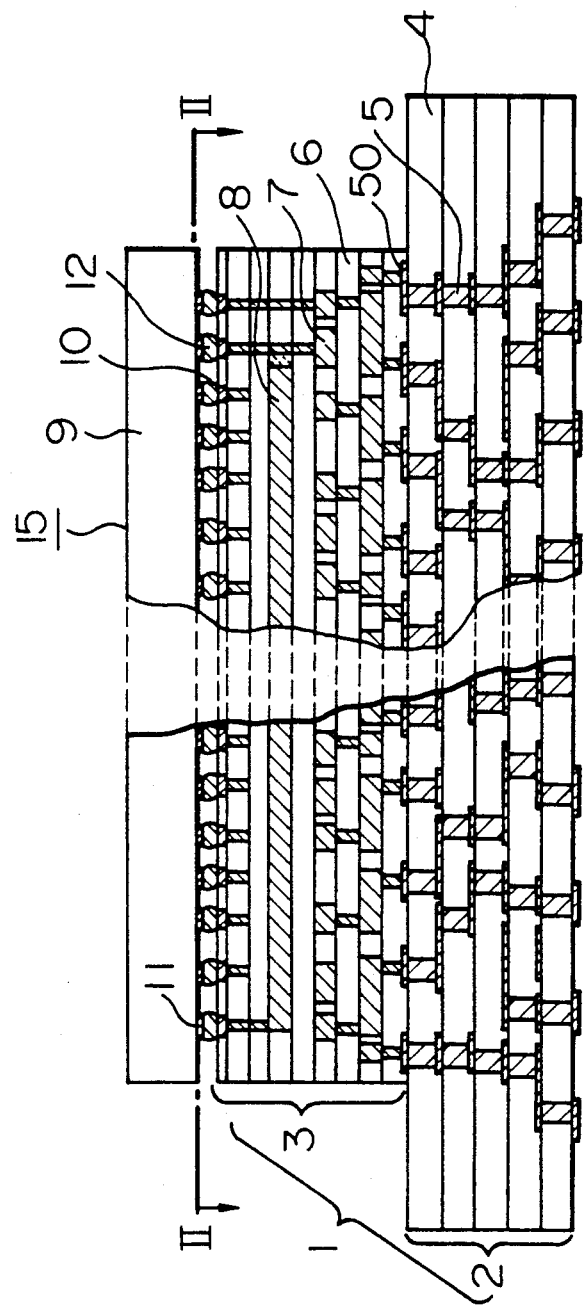
FIG. 1 is a sectional view of a semiconductor chip carrier according to a first embodiment of the present invention.
Figure 2:
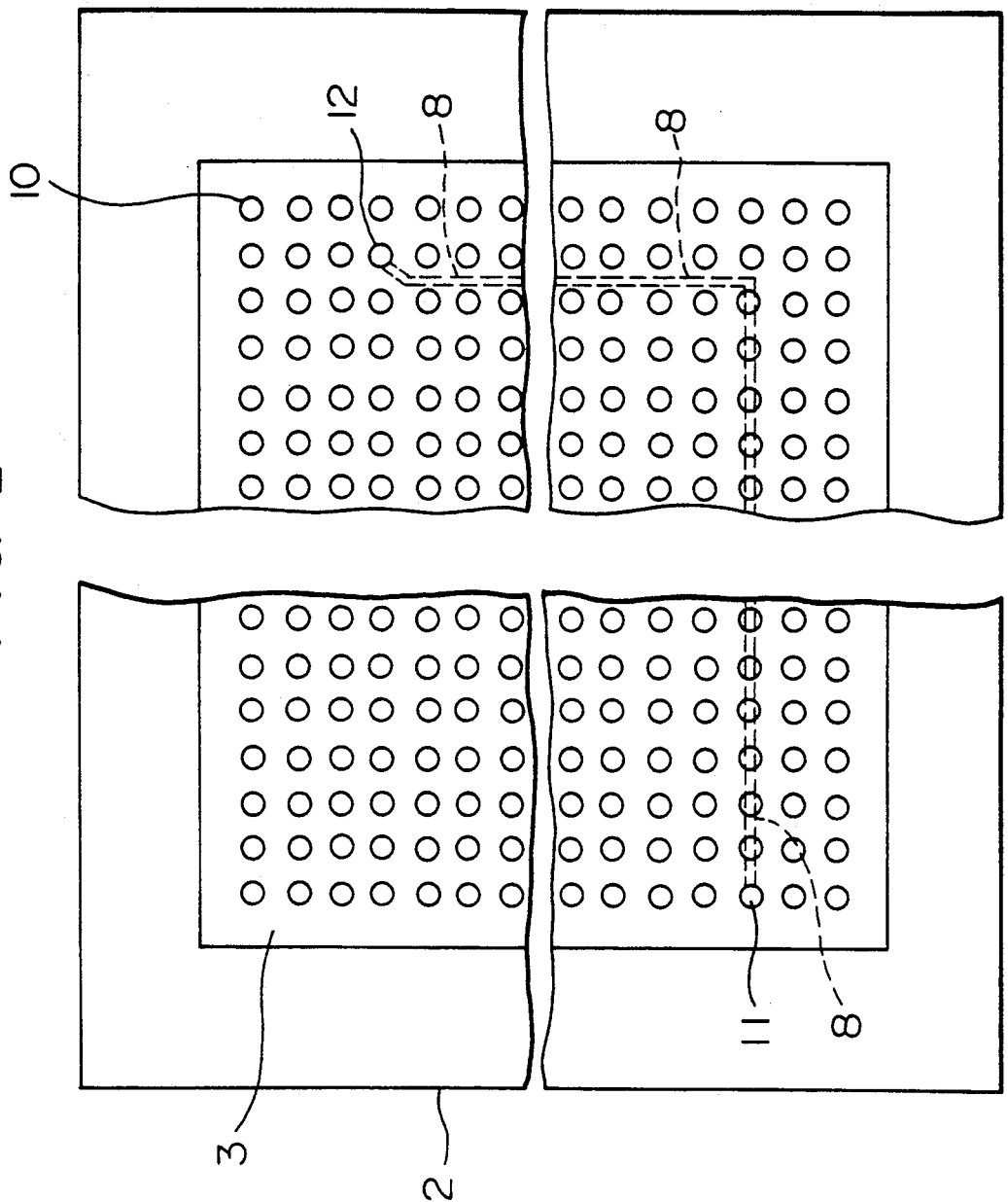
FIG. 2 is a plan view taken along the line II—II in FIG. 1.

FIG. 1 is a schematic sectional view of a semiconductor chip carrier 15 according to a first embodiment of the present invention. FIG. 2 is a plan view taken along the line II—II in FIG. 1 before an LSI chip 9 is mounted.

As shown in FIGS. 1 and 2 the semiconductor chip carrier 15 comprises a chip carrier board 1, including a multi-layer ceramic board 2 and a thin film circuit 3, and an LSI chip 9 which is mounted on the thin film circuit 3. The chip carrier board 1 is made by forming the thin film circuit 3, including a nine-layer polyimide layer 6 and copper wires 7, on the surface of the fivelayer ceramic board 2, including five alumina layers 4 and tungsten conductors 5, and on top of the thin film circuit 3, the LSI chip 9, which is a semiconductor chip, is mounted and the thin film circuit 3 and the LSI chip 9 are connected with solder 10.

FIG. 2 is a plan view of the multi-layer ceramic board 2 before the LSI chip 9 is mounted. In the thin film circuit 3, a signal path 8 of low resistance is formed to connect between signal terminals 11 and 12 of the LSI chip 9 mounted on the thin film circuit 3. In this embodiment, the signal path 8 (indicated by the broken line) is formed in the wiring parallel with the periphery of the LSI as in the wiring on the LSI chip 9.

This semiconductor chip carrier 15 was manufactured by the procedure described below.

(1) Fabrication of a multi-layer ceramic board 2:

A required wiring is formed on each alumina green sheet using a tungsten paste by a well-known method. Part of the paste is filled in the via-holes in the sheets. A necessary number of the alumina sheets are laminated (five in this embodiment) with reference to guide holes, not shown, which are formed at the four corners. The alumina sheets are pressurized at 120° C. to form a laminated body. The laminated body is heated at 1600° C. in the atmosphere of hydrogen to make a multilayer ceramic board 2.

(2) Formation of a thin film circuit 3:

(1) Cr/Cu, which serves as a base film 50 for plating, is deposited in patterning on the electrode wiring section formed on the multi-layer ceramic board 2, and then coated with a polyimide film and baked at 350° C. The polyimide film on the plating base film 50 mentioned above is etched selectively by dry etching. Then, a copper wiring 7 is formed by a well-known electroless copper plating method in the grooves in the processed polyimide film.

(2) By repeating the steps of polyimide film deposition, dry etching, and formation of copper wiring 7 by the electroless copper plating in (1) above, a thin film circuit 3 is formed which is a multi-layer thin film wiring structure including a total of nine layers, with polyimide films 6 used as layer insulating films. In addition, a conductor path 8 for connecting the signal terminals 11 and 12 of the semiconductor chip is formed at the sixth layer (which may be any other layer) from the lowermost layer of the thin film circuit 3. The width and the film thickness of the conductor path 8 are both 20 μm. The chip carrier board 1 was thus fabricated.

(3) Mounting the semiconductor chip:

An LSI chip 9 is mounted on the thin film circuit 3 and they are connected with a solder 10 by heating to about 350° C.

By the above method, a semiconductor chip carrier was manufactured.

(4) Evaluation of the wiring resistance and delay time of the conductor path 8:

Table 1 shows characteristics compared between the conductor path 8 of a semiconductor chip carrier 15 manufactured according to this embodiment and the prior art conductor path 8 formed on an LSI chip prepared as a comparative example. As is obvious from Table 1, the conductor path 8 according to this embodiment of the present invention has a delay time 1/10 shorter than in the prior art, and therefore, its effectiveness has been confirmed.

As for the specimens used for measurement, the size and shape of the LSI chips 9 and thin film circuits are respectively 10 mm square, the length and shape of the conductor paths 8 are 15 mm and in an L-like configuration, and the size and shape of the multi-layer ceramic board are 14 mm square.

TABLE 1

| Item | Formed on a chip (Prior-art example) | Formed on a chip carrier board (Embodiment of this invention) |
|---|---|---|
| Wiring material | Aluminum | Copper |
| Width × thickness × length | 2 μm × 0.2 μm × 15 mm | 20 μm × 20 μm × 15 mm |
| Wiring resistance (Ω) | 1010 | 0.64 |
| Delay time (ps) | 1100 | 91 |

Figure 3:
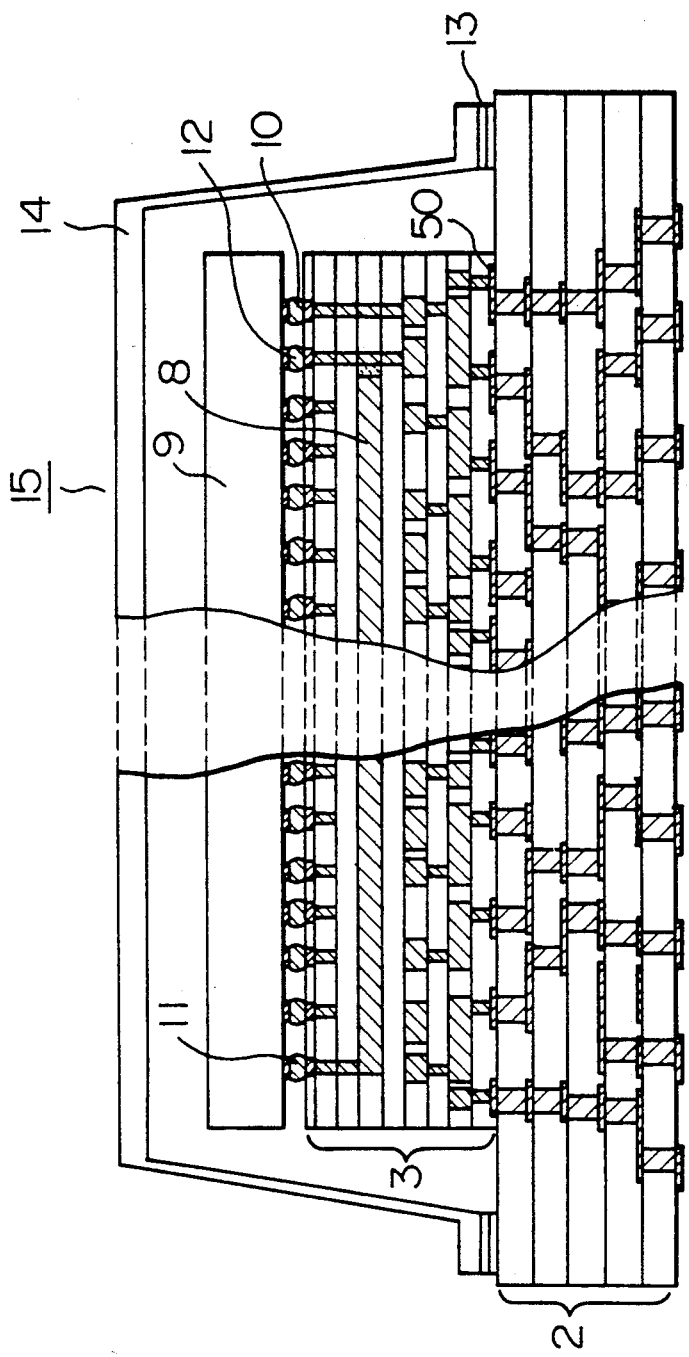
FIG. 3 is a sectional view of a semiconductor chip carrier according to a second embodiment of the present invention.

FIG. 3 is a schematic sectional view of the semiconductor chip carrier 15 as a second embodiment of the present invention. A semiconductor chip carrier was manufactured by a method substantially the same as in the first embodiment. Only difference in respect of manufacture is that a sealing cap 14 was attached to seal the LSI 9 on the chip carrier in order to protect from moisture or contamination.

As for the manufacturing method, after a ceramic board was manufactured, a titanium-gold thin film is formed by masked vapor deposition at a peripheral portion of the surface of the board, and the deposited film is used as a sealing part 13. Then, a nine-layer thin film circuit 3 is formed on the board 2. At the sixth layer (which may be any other layer) from the lowermost layer of the thin film circuit, a path 8 is formed which connects the signal terminals of the semiconductor chip like in the first embodiment of the present invention. The width and the thickness of the path are both 20 μm. In addition, an LSI chip 9 is mounted on the thin film circuit 3 and connected to it. Finally, the sealing cap 14 made of Kovar (29Ni-18Co-Fe) is connected to the sealing part 13 with a solder of lower melting point than that of the solder 10 for connecting the LSI chip 9 and by heating to about 300° C. In this manner, a semiconductor chip carrier 15 shown in FIG. 3 was formed. By the evaluation of the wiring resistance and delay time of the conductor path 8, the same results as in the first embodiment were obtained.

Figure 4:
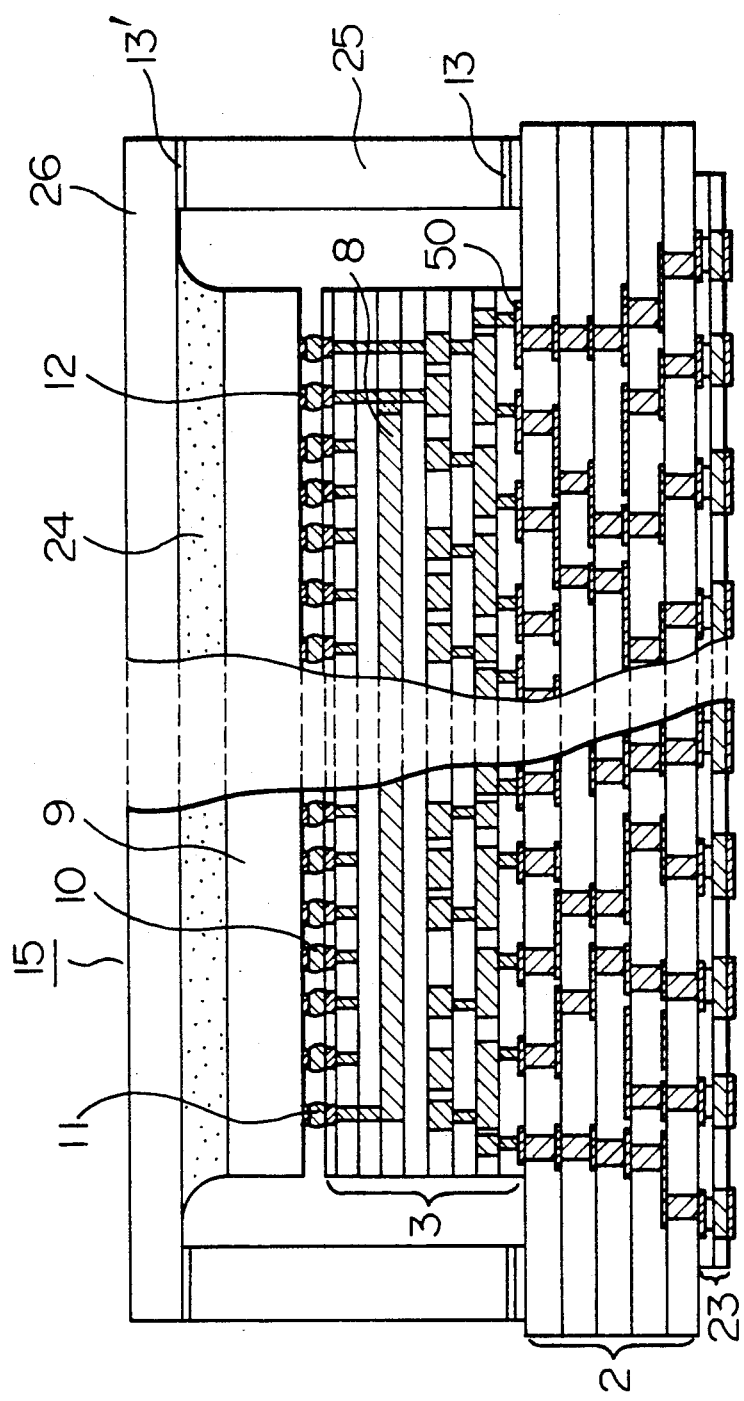
FIG.4 is a sectional view of a semiconductor chip carrier according to a third embodiment of the present invention.

FIG. 4 is a schematic sectional view showing a structural example of a semiconductor chip carrier 15 as a third embodiment of the present invention. By a method substantially the same as in the second embodiment, the semiconductor chip carrier 15 was manufactured. The manufacturing method is described below.

After a multi-layer ceramic board 2 is manufactured, a titanium-gold thin film is formed by masked vapor deposition on the peripheral portion of the surface of the ceramic board, and this thin film is used as a sealing part 13. Then, a thin film circuit 23 is formed which comprises two layers on the back side of the ceramic board by a process equivalent to the one used in forming the thin film circuit in the first embodiment. After this, a thin film circuit 3 is formed comprising nine layers by an equivalent process on the top surface of the ceramic board. A conductor path 8 for connecting the signal terminals of the semiconductor chip at the sixth layer (which may be any other layer) from the lowermost layer of the thin film circuit 3. The width and the film thickness of the path are both 20 μm. The LSI chip 9 connected with a aluminum nitride plate 26 (serving also as a sealing cap) with a high-temperature solder 24 is mounted on the thin film circuit 3. When the LSI chip 9 is connected to the thin film circuit 3 with a solder 10, sealing frames 25 of aluminum nitride is mounted on the ceramic board 2, and sealing parts 13 and 13' are connected with a solder by heating to about 350°.

By this structure, the heat generated while power is applied to the LSI chip 9 is transferred through the high-temperature to the aluminum nitride plate 26, and dissipated efficiently, thereby allowing the LSI chip 9 to operate stably. In this manner, the semiconductor chip carrier 15 shown in FIG. 4 was manufactured.

The thin film circuit 23 is formed to rectify a possible displacement of the electrodes of the ceramic board 2. More specifically, the ceramic board 2 is formed by baking green sheets on which circuit patterns have been formed by a conductive paste. Even though circuit patterns are formed with estimated shrinkage during baking taken into account, the pattern may be somewhat displaced. Therefore, in order to ensure the connection reliability of the pins connected to the electrodes of the ceramic board, the thin film circuit 23 is provided.

Figure 5:
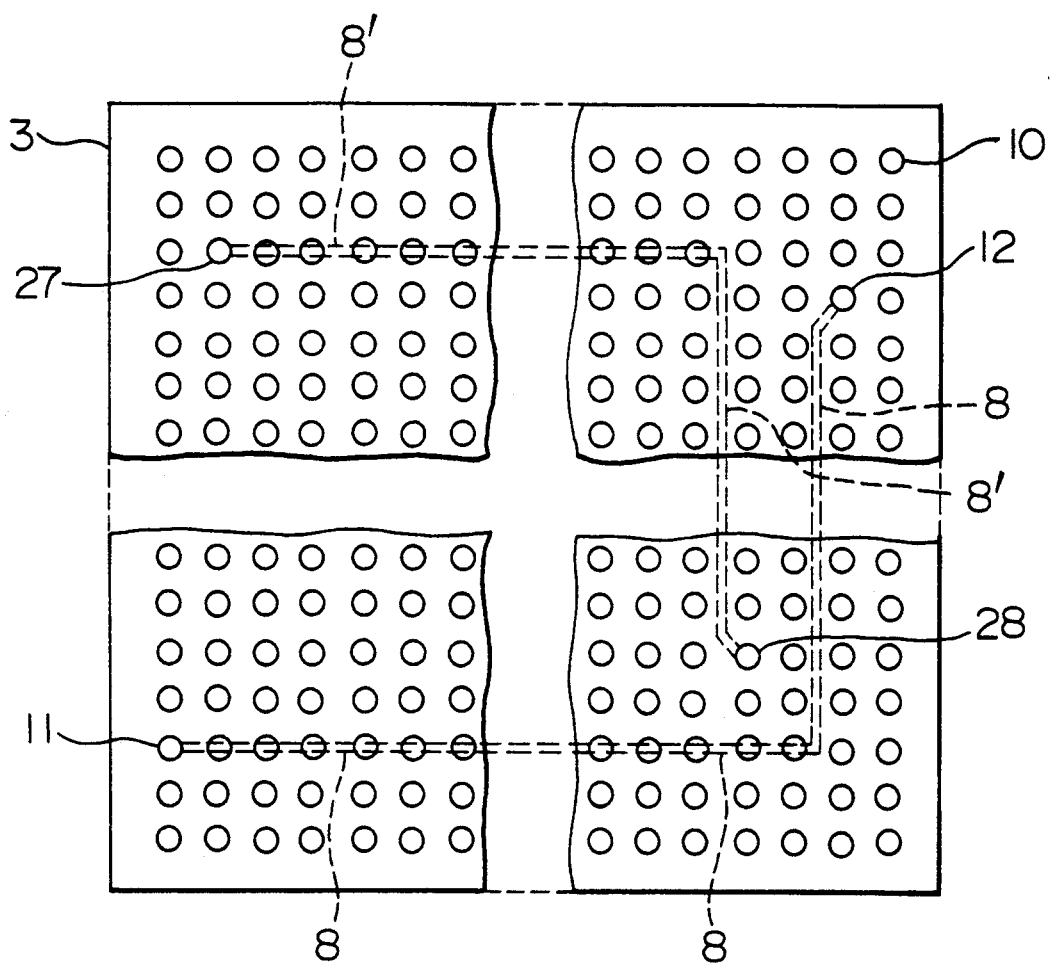
FIG. 5 is a schematic plan view of a thin film circuit according to a fourth embodiment of the present invention, wherein two conductor paths are provided in the thin film circuit in the semiconductor chip carrier according to the invention.

FIG. 5 is a plan view of the thin film circuit block 3 as a fourth embodiment of the present invention. In this embodiment, two paths 8 and 8' are provided in the thin film circuit block 3 on the semiconductor chip carrier board. In other words, in the structure equivalent to the semiconductor chip carrier 15 shown in the second embodiment, two low-resistance paths for connecting the signal terminals of the LSI chip were formed. One 18 of the two paths connects the signal terminals 11 and 12 of the semiconductor chip, and the other one 8' connects the signal terminals 27 and 28. In the signal paths, the main wirings were formed along the peripheral sides of the LSI like in the wiring formed on the LSI.

Figure 6:
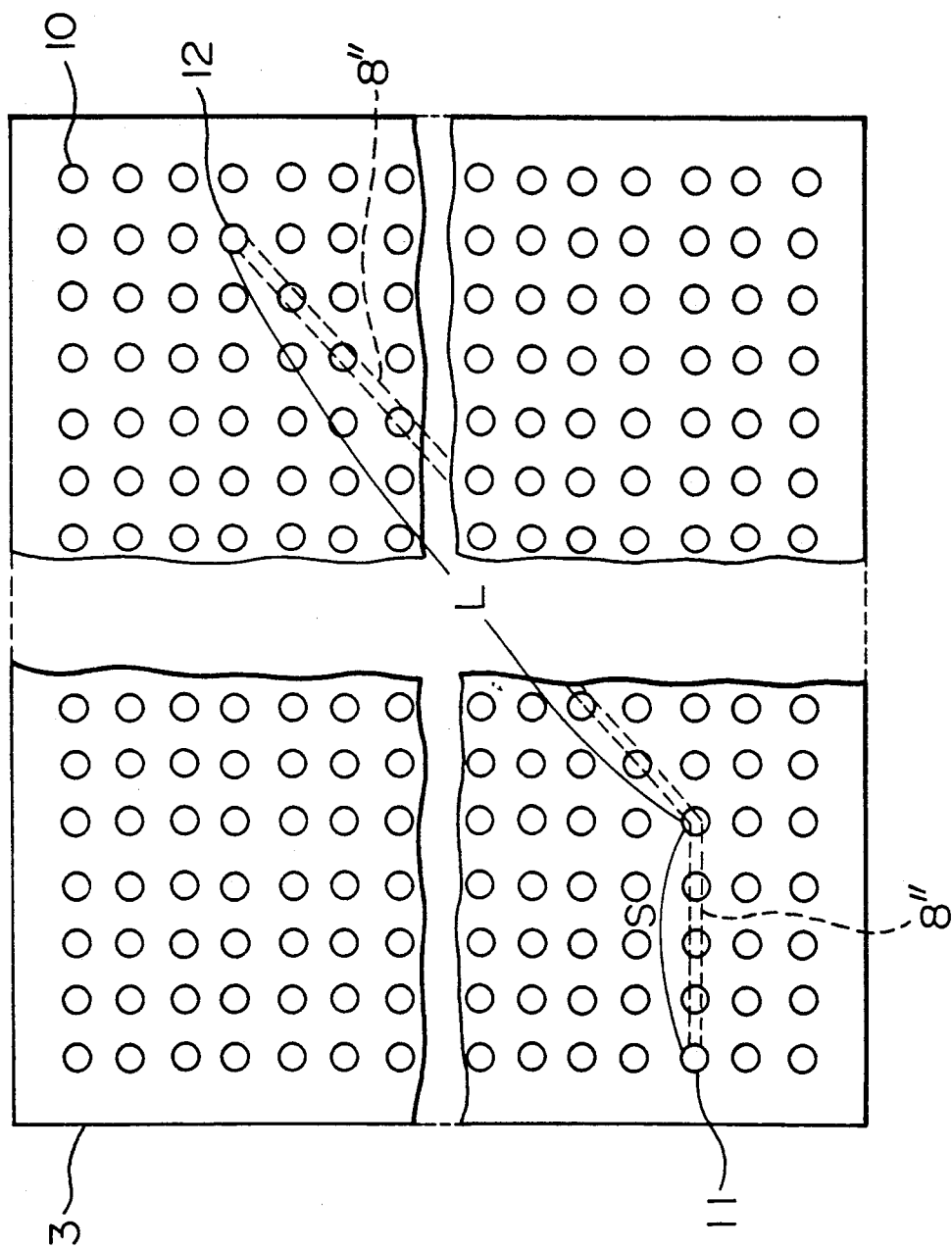
FIG. 6 is a schematic plan view of a thin film circuit according to a first embodiment of the present invention.

FIG. 6 is a plan view of a thin film circuit block 3 as a fifth embodiment of the present invention. In this embodiment, the feature lies in the shape of the path 8" provided in the thin film circuit 3 in the semiconductor chip carrier, that is, the path 8" comprises a short portion S parallel with the peripheral side, and a long portion L inclined with respect to the peripheral side. In other words, in the structure equivalent to the one shown in the second embodiment, one lowresistance path 8" for connecting the signal terminals of the LSI chip is formed, whereby the signal terminals 11 and 12 of the semiconductor chip are connected. The signal path 8" is different from the wiring formed on the LSI, and the short portion S stretches along the peripheral side of the LSI, but the long portion (main wiring) L lies 45° inclined with respect to the wiring of the LSI.

Figure 7:
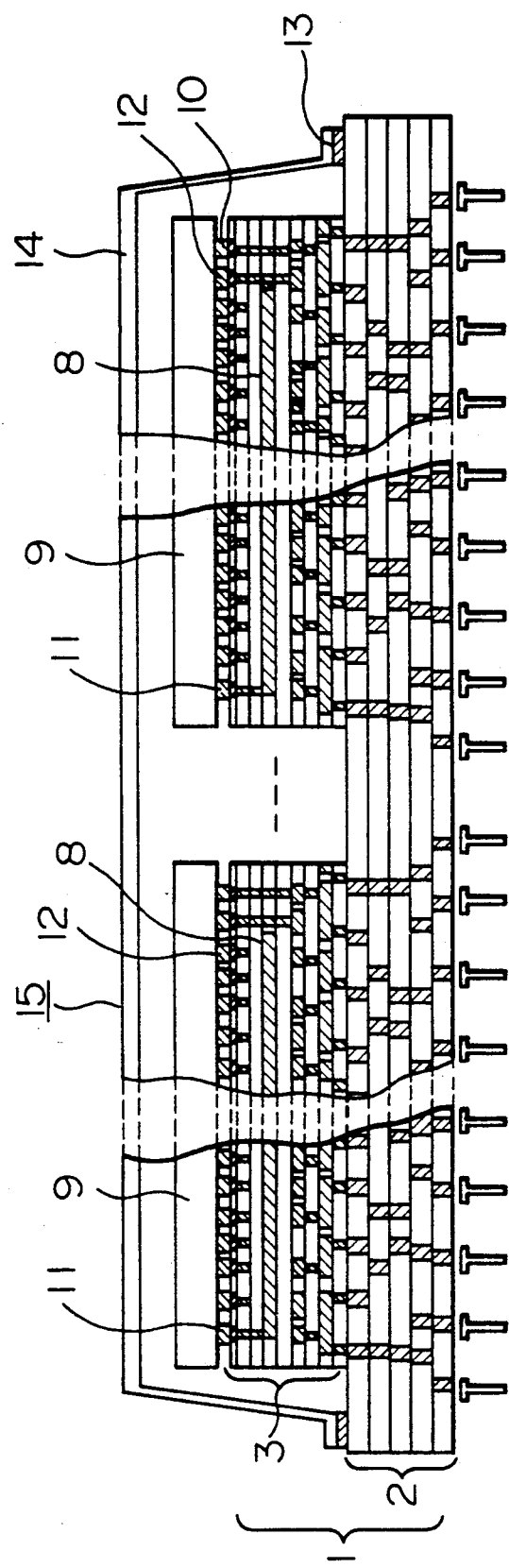
FIG. 7 is a sectional view of a semiconductor chip carrier according to a sixth embodiment of the present invention.

FIG. 7 is a sectional view of a semiconductor chip carrier as a sixth embodiment of the present invention. The feature of this embodiment is that a plurality of LSI chips 9 are mounted on the same chip carrier board 1 and sealed. To be more specific, the chip carrier was manufactured by a method similar to the method for the semiconductor chip carrier shown in FIG. 2. Nine semiconductor chips 9 were mounted in the chip carrier. The chip carrier 1 comprises a multi-layer ceramic board 2 and a thin film circuit 3, and was manufactured by the same process as in the second embodiment. However, four circuit blocks of the board are provided separately for the corresponding semiconductor chips. After the LSI chip 9 was mounted on the thin film circuit 3, all of the chips are covered by a sealing cap 14, and connected and sealed by a sealing part 13 with a solder by heating to about 300° C.

Figure 8:
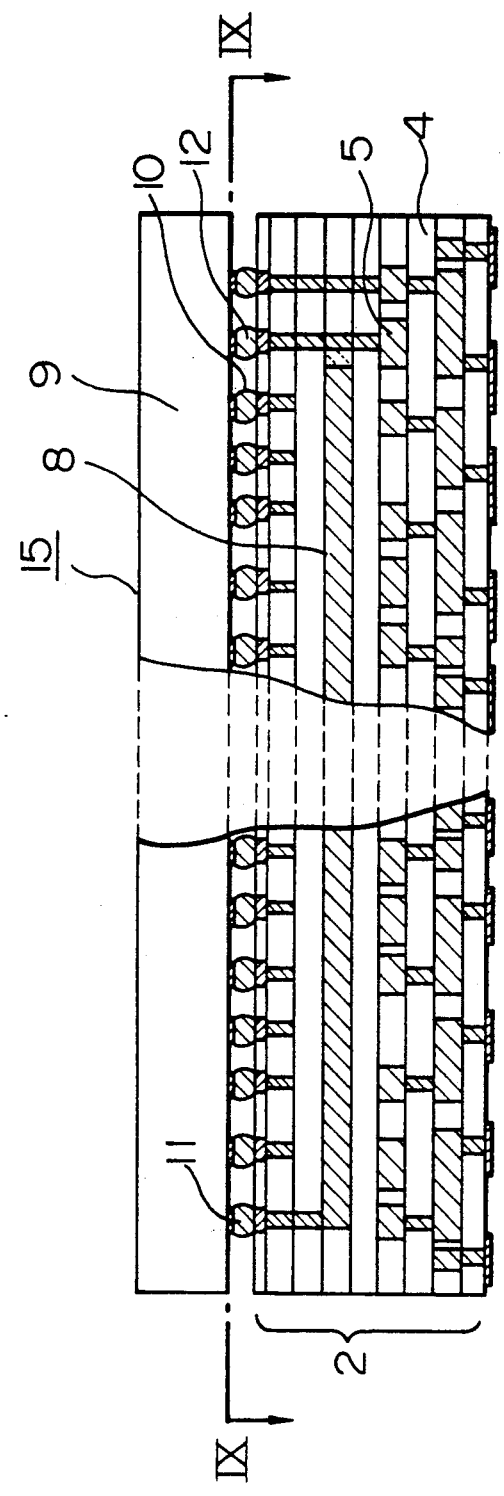
FIG. 8 is a sectional view of a semiconductor chip carrier according to a seventh embodiment of the present invention.
Figure 9:
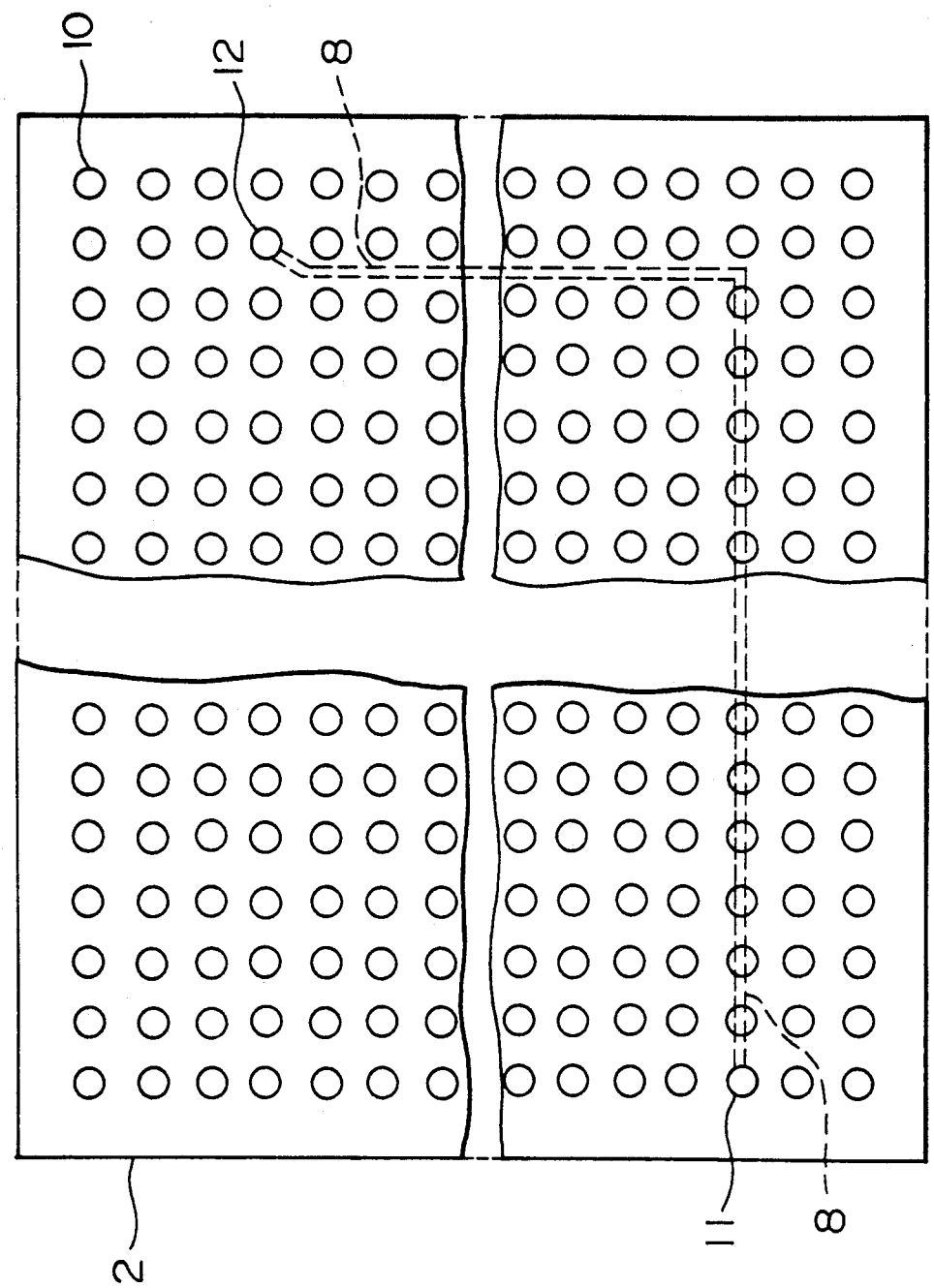
FIG. 9 is a plan view taken along the line IX—IX in FIG. 8.

FIG. 8 is a sectional view of a semiconductor chip carrier 15 as a seventh embodiment of the present invention. FIG. 9 is a plan view of the carrier board 1 constituting a part of the semiconductor chip carrier 15, taken along the line IX—IX in FIG. 8. The feature of the seventh embodiment is that the carrier board 1 is constituted only by a multi-layer ceramic board 2 and the thin film circuit 8 was omitted. The manufacturing method of the chip carrier 15 is the same as in the first embodiment, but when the multi-layer ceramic board 2 was manufactured, a conductor path 8 was provided in the ceramic board 2, which connects the terminals 11 and 12 of the LSI chip 9.

Figure 10:
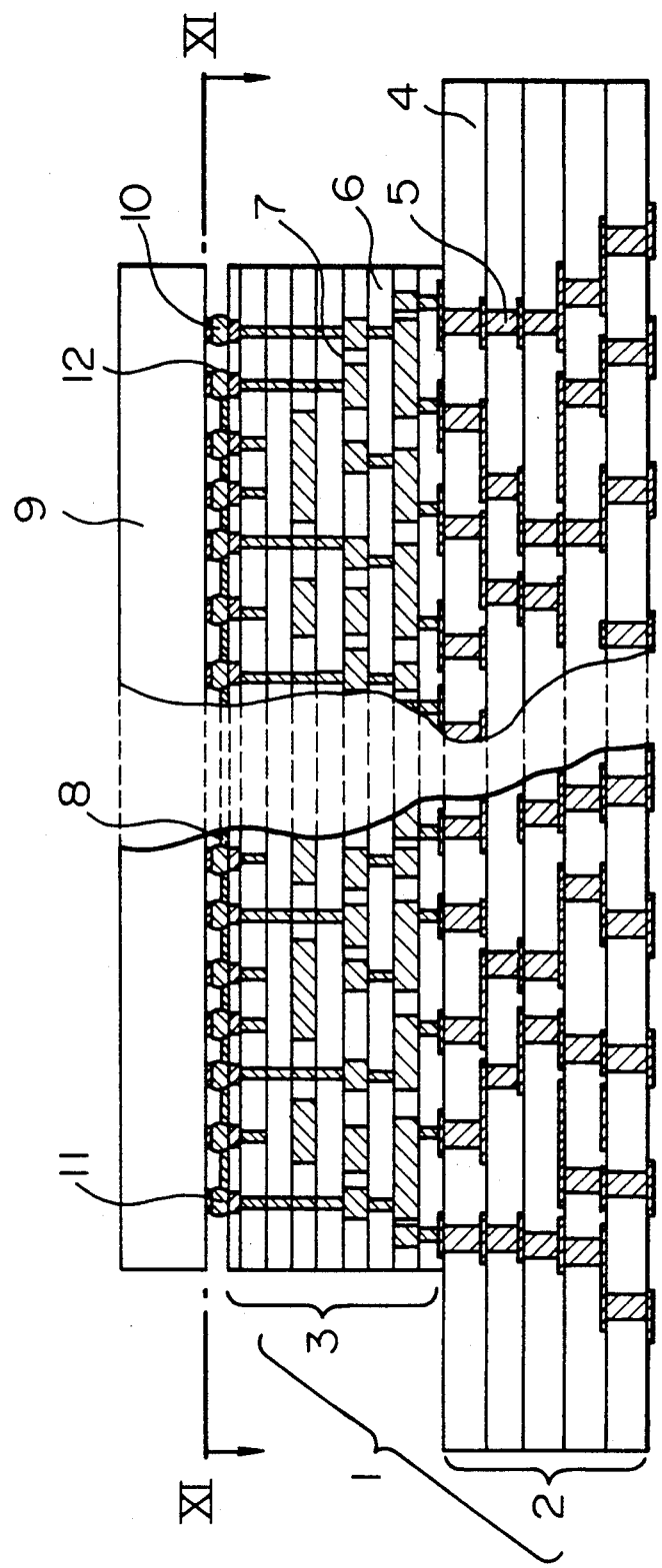
FIG. 10 is a sectional view of a semiconductor chip carrier according to..an eighth embodiment of the present invention.
Figure 11:
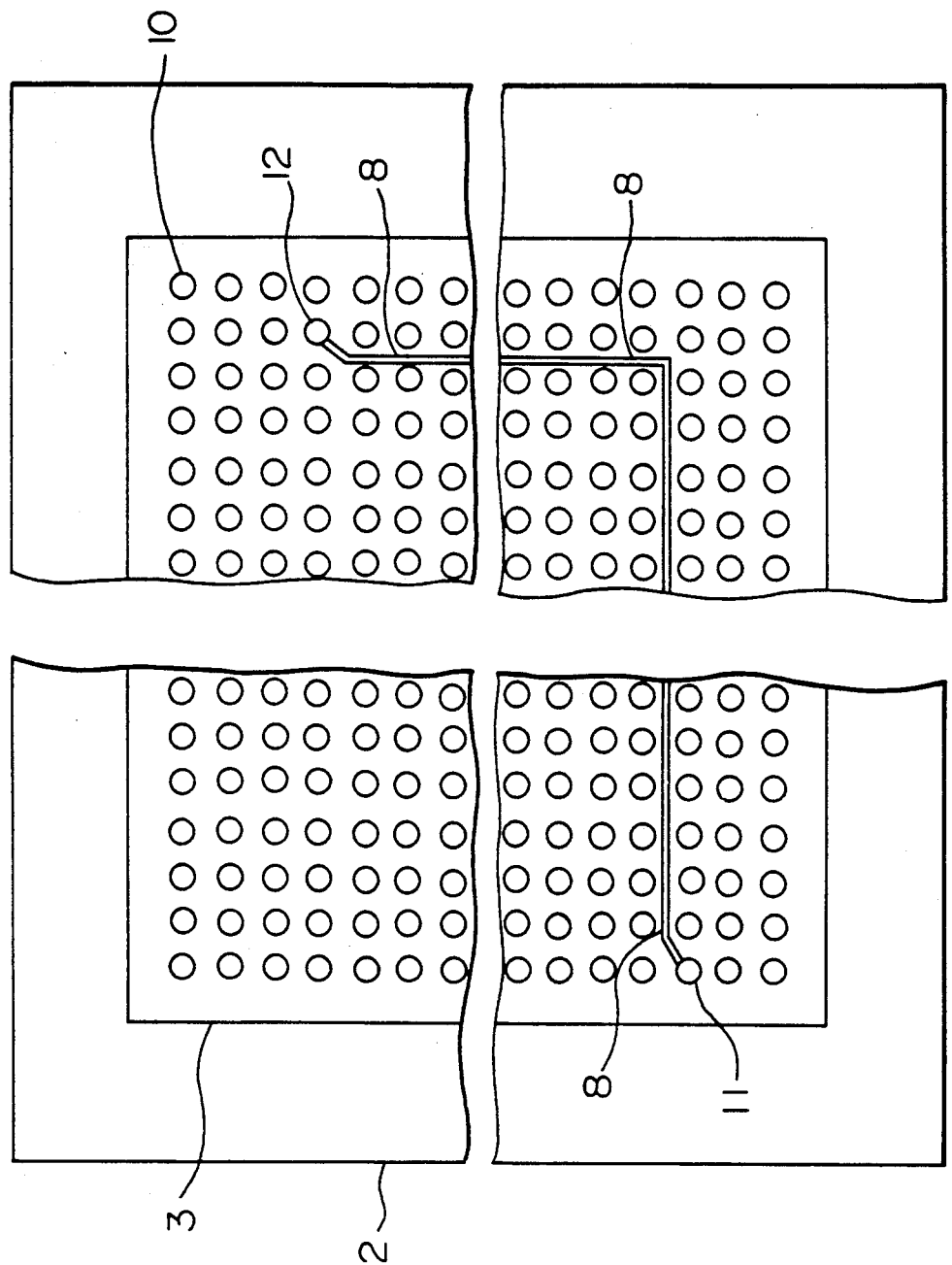
FIG. 11 is a plan view taken along the line XI—XI in FIG. 10.

FIG. 10 is a sectional view of a semiconductor chip carrier as an eighth embodiment of the present invention. FIG. 11 is a plan view of the semiconductor chip carrier, taken along the ling XI—XI in FIG. 10. The feature of the eighth embodiment is that the conductor path 8 was provided not inside but on the surface of the thin film circuit 3. The manufacturing method of the chip carrier is the same as in the second embodiment, but when the thin film circuit was formed, a conductor path 8 was provided on the surface of the highest polyimide layer 6, which connects the terminals 11 and 12 of the LSI chip 9.

Figure 12:
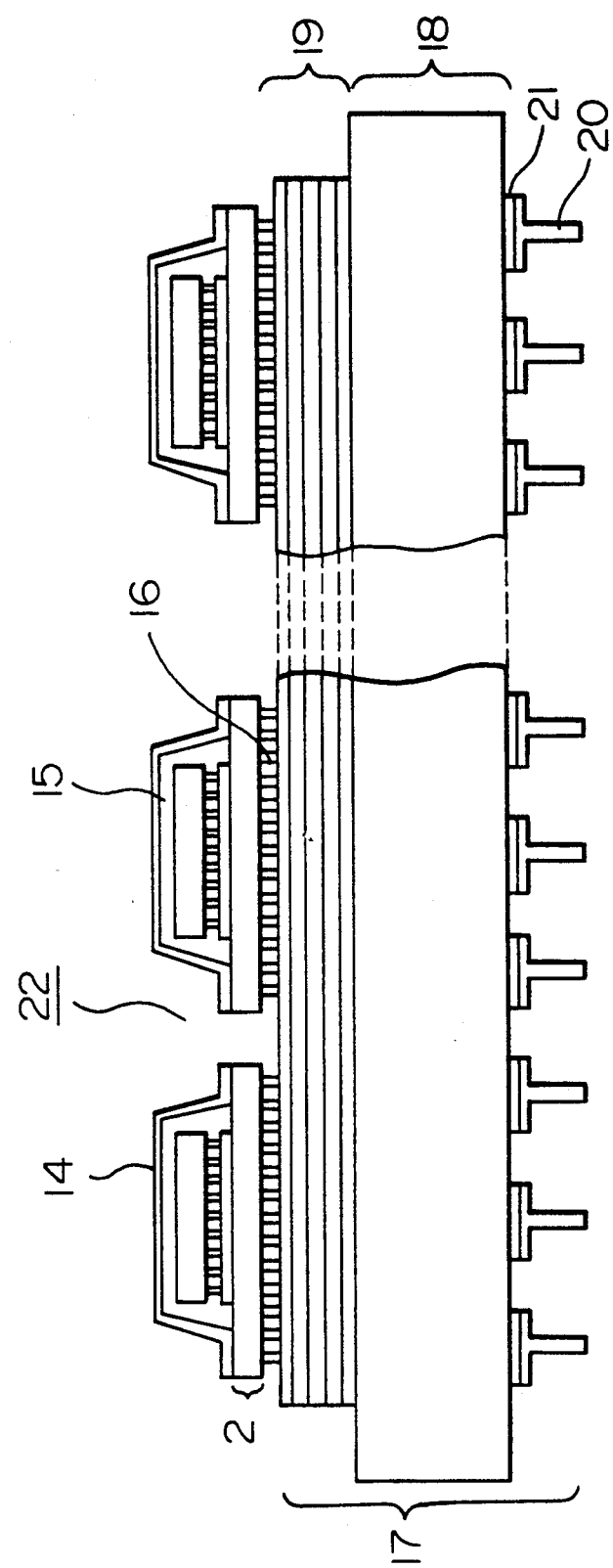
FIG. 12 a schematic sectional view of a module according a ninth embodiment of the present invention, wherein a semiconductor chip carrier shown in FIG. 3 is mounted to connected on a thick film/thin film hybrid module substrate.

FIG. 12 is a schematic sectional view of a module as ninth embodiment of the present invention. The module 22 was manufactured by mounting and connecting semiconductor chip carriers 15 shown in FIG. 3 to a thick film/thin film hybrid board 17.

Pins 20 were connected and fixed to the back side of the thick film/thin film hybrid board 17 with a high-temperature solder 21 by heating to about 410° C. The hybrid board 17 comprises a thick film board 18 and a thin film circuit 19. Semiconductor chip carriers 15 were connected and mounted to the surface of the thin film circuit 19 of the hybrid board with a solder of a lower melting point than the solder 21 by heating to about 250° C. A total of 81 semiconductor chip carriers 15 were mounted. In FIG. 12, needless to say, the module can be manufactured by using another embodiment of the semiconductor chip carrier.

Figure 13:
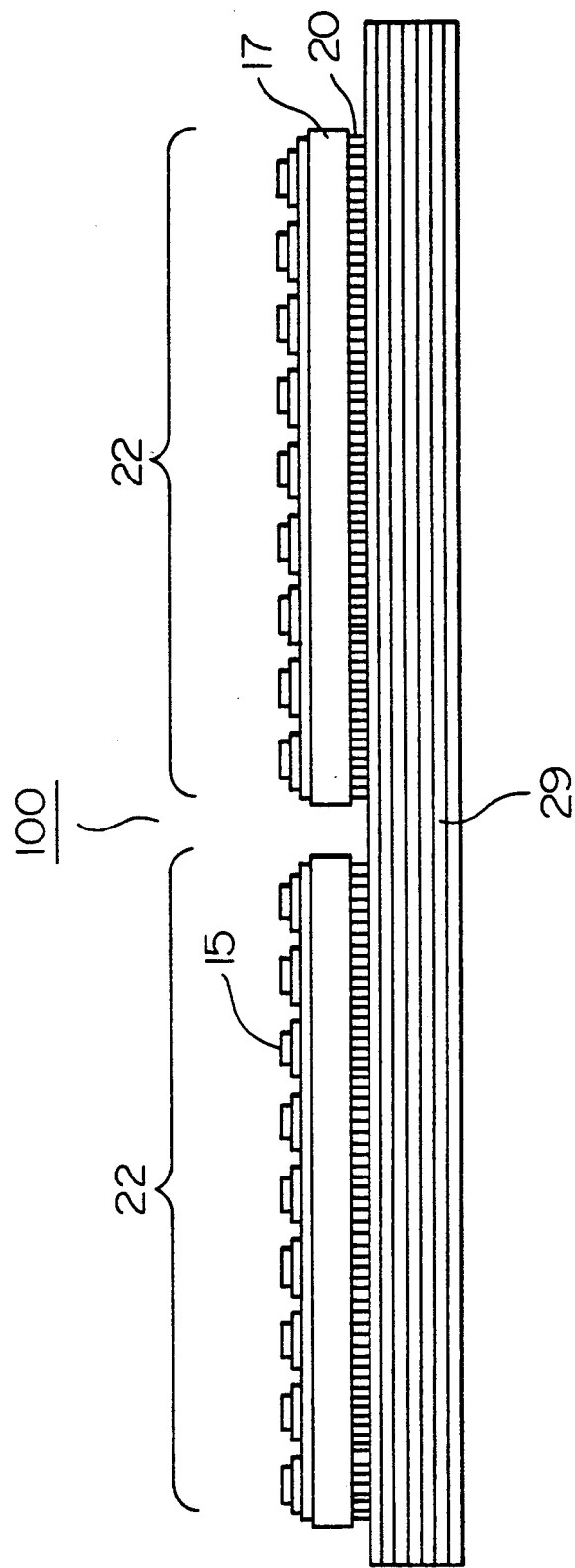
FIG. 13 is a schematic sectional view for explaining a logic package structure of a computer according to a tenth embodiment of the present invention, wherein four modules, shown in FIG. 12, are mounted on the printed wiring substrate.

FIG. 13 is a schematic sectional view of a processor board (logic package) 100 constituting an electronic device which is mounted in a computer memory unit as a tenth embodiment of the present invention. The logic package 100 shown in FIG. 13 was made by mounting four modules in FIG. 12 on a printed wiring substrate 29 with interposition of pins 20. A computer was organized by combining this logic package with a memory package, and an input/output processing package. In FIG. 13, it goes without saying that the logic package 100 can be formed by mounting another type of modules manufactured according to another embodiment of the semiconductor chip carrier.

In the above-mentioned embodiments, description has been made of cases in which alumina is used as the material of the multi-layer ceramic board 2, but it is of course possible to apply a ceramic such as mullite, a glass ceramic made of ceramic powder and glass, or glass only. Accordingly, it is obviously possible to apply conductors, such as molybdenum, nickel, silver-palladium, gold, platinum, etc. besides tungsten for the wiring conductive materials of the ceramic board.

As shown in the seventh embodiment, the thin film circuit 3 on the ceramic board is not always required. A low-resistance path 8 may be formed on the surface of or in the multi-layer ceramic board 2 by the same process as was used in providing it in the thin film circuit 3, and a semiconductor chip may be directly mounted and connected to the ceramic board with a solder.

In the above description, the polyimide films were used for the layer insulating films 6 of the thin film circuit 3, but it is possible to apply other organic insulating materials, such as polyetetrafluoroethylene and an epoxy resin. Needless to say, wiring materials, such as gold and aluminum other than copper for the thin film wiring 8.

As ways of connecting a semiconductor chip, such as LSI, to a wiring substrate, there are methods other than the soldering surface connection method described referring to the embodiments. They include the use of a conductive paste available on the market and fusion by heating, pressing, and application of energy, such as ultrasonic waves.

This invention has been described by showing representative embodiments. Description will now be made of the effects of the invention.

(1) The signal delay time of the semiconductor chip can be shortened to about 1/10. High speed signal processing can be achieved in modules and electronic equipment in which this invention is applied.

(2) Heretofore, when a low-resistance conductor path is formed in a semiconductor chip, a special process is required. That is to say, it is necessary to use a process in which a wider and thicker wiring conductor is used and the wiring material has been changed from commonly used aluminum to copper or the like which has a low resistivity. In this respect, the present invention is advantageous in that wiring is formed on a chip carrier board, so that the wiring conductor width and thickness can be increased. It is easy to apply wiring materials with low resistivity, such as copper. Therefore, a semiconductor chip carrier according to the present invention is easier to manufacture than prior-art ones.

(3) For the same reason as in (2) above, higher yield can be obtained by forming a low-resistance path for connecting signal terminals in a semiconductor chip on a chip carrier board, and then completing a chip carrier by making a combination of a conforming board and a conforming semiconductor chip, than forming a wiring with low resistance on a conforming semiconductor by allowing a different process to intervene.

What is claimed is:

1. In a semiconductor chip carrier comprising:
    a semiconductor chip mounted and connected to a multi-layer wiring substrate;
    a conductor path for connecting signal terminals in the semiconductor chip at electrically low resistance;
    means for securing the conductor path relative to said multi-layer wiring substrate such that the conductor path is provided in a position of at least one of (a) on said multi-layer wiring substrate, and (b) in said multi-layer wiring substrate.

2. A semiconductor chip carrier according to claim 1, wherein said multi-layer wiring substrate includes:
    a first multi-layer wiring substrate constituted by a multi-layer ceramic board; and
    a multi-layer wiring conductor constituted by a thin film circuit laminated and electrically connected to said first multi-layer wiring conductor; and
    wherein said semi conductor chip is mounted and electrically connected to said second multi-layer wiring conductor.

3. A semiconductor chip carrier according to claim 2, wherein layer insulating films of said second multi-layer wiring conductor constituted by said thin film circuit are comprised of heat-resistant organic insulating films.

4. A semiconductor chip carrier according to claim 3, wherein said heat-resistant organic insulating films are comprised of polyimide resin films.

5. A semiconductor chip carrier according to claim 1, wherein said conductor path includes a longest portion for connecting the signal terminals in said semiconductor chip at electrically low resistance, which longest portion is directed in parallel with the direction of a main wiring disposed at least one of inside said semiconductor chip and on the surface of said semiconductor chip.

* * * * *

UNITED STATES PATENT AND TRADEMARK OFFICE
CERTIFICATE OF CORRECTION

PATENT NO. : 5,281,151

DATED : January 25, 1994

INVENTOR(S) : Hideo Arima, et al.

It is certified that error appears in the above-identified patent and that said Letters Patent is hereby corrected as shown below:

Claim 2, column 12, line 7, before "multi-layer" insert --second--.

Signed and Sealed this

Thirty-first Day of May, 1994

Attest:

BRUCE LEHMAN

*Attesting Officer*  *Commissioner of Patents and Trademarks*